(12) United States Patent
Koga

(10) Patent No.: US 7,471,550 B2
(45) Date of Patent: Dec. 30, 2008

(54) MAGNETIC MEMORY

(75) Inventor: Keiji Koga, Tokyo (JP)

(73) Assignee: TDK Corporation, Tokyo (JP)

( * ) Notice: Subject to any disclaimer, the term of this patent is extended or adjusted under 35 U.S.C. 154(b) by 168 days.

(21) Appl. No.: 11/709,053

(22) Filed: Feb. 22, 2007

(65) Prior Publication Data

US 2007/0195594 A1     Aug. 23, 2007

(30) Foreign Application Priority Data

Feb. 23, 2006   (JP) .................... P2006-047121

(51) Int. Cl.
*G11C 11/00* (2006.01)
(52) U.S. Cl. .................. 365/158; 365/171; 257/421
(58) Field of Classification Search .......... 365/171, 365/158; 257/421, E21.665; 977/934, 935
See application file for complete search history.

(56) References Cited

U.S. PATENT DOCUMENTS 6,072,718 A * 6/2000 Abraham et al. ............ 365/173
2007/0164380 A1 * 7/2007 Min et al. .................... 257/421

FOREIGN PATENT DOCUMENTS

JP       A 11-120758       4/1999

OTHER PUBLICATIONS

"Spin-torque transfer in batch-fabricated spin-valve magnetic nanojunctions," Journal of Applied Physics, May 15, 2003, vol. 93 No. 10, pp. 6859-6863.

"Spin Pumping in Ferromagnetic-Metal/Normal-Metal Junctions," Journal of the Magnetic Society of Japan, 2003, vol. 27, No. 9 pp. 934-939.

* cited by examiner

*Primary Examiner*—J. H. Hur
*Assistant Examiner*—Harry W Byrne
(74) *Attorney, Agent, or Firm*—Oliff & Berridge, PLC

(57) ABSTRACT

A magnetoresistance effect element is also located between second wiring and common wiring. The magnetoresistance effect element is electrically connected to the second wiring without a spin filter. When a reading current is supplied between the second wiring for supplying a reading current and the common wiring, since this is not supplied via a spin filter, no spin polarized current is supplied into the magnetoresistance effect element, so that it becomes difficult to magnetization-reverse a magnetosensitive layer. Even in a structure where, in order to improve recording density, the magnetosensitive layer is reduced in area so as to lower a writing current, no magnetization reversal occurs due to a supply of the reading current, and information can be read out without making the reading current considerably small in comparison with the writing current.

5 Claims, 12 Drawing Sheets

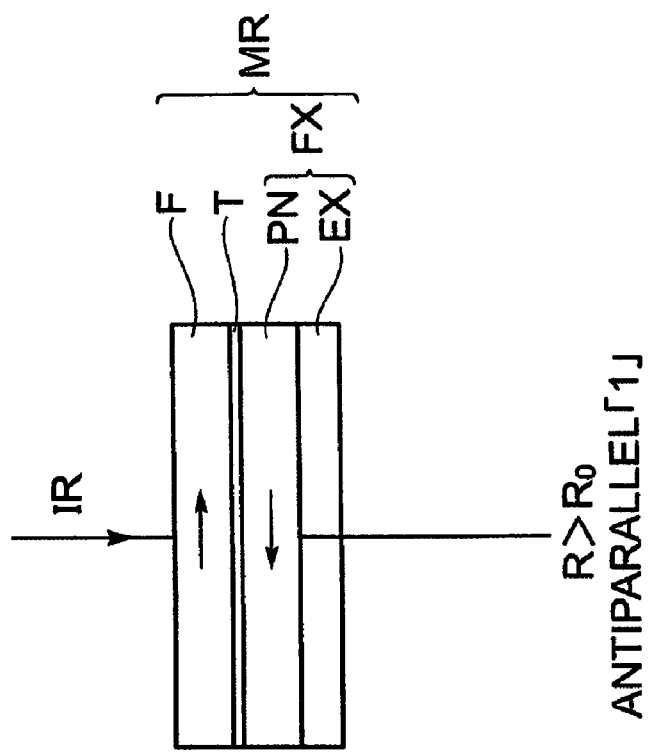
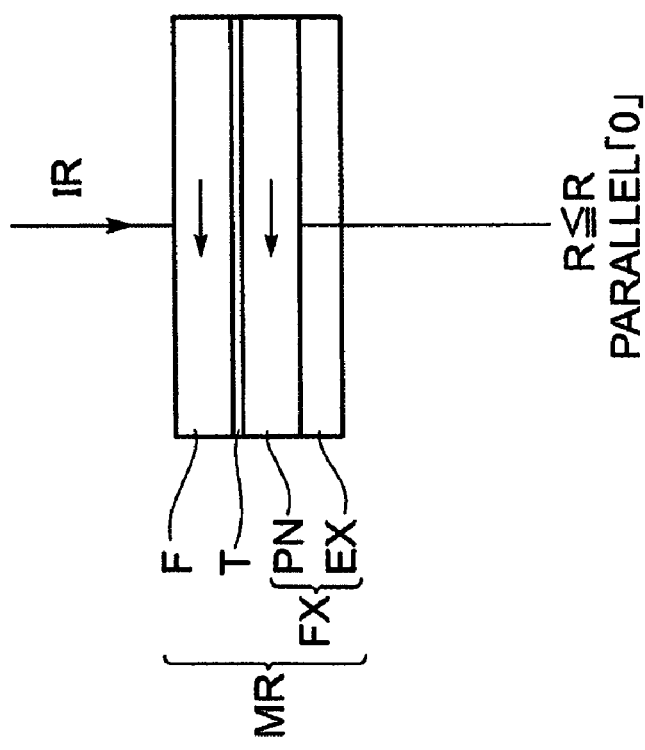

MAGNETIC MEMORY

BACKGROUND OF THE INVENTION

1. Field of the Invention

The present invention relates to a magnetic memory.

2. Related Background Art

An MRAM (Magnetic Random Access Memory) has a structure where TMR (Tunnel Magnetoresistance) elements are disposed at junctions between bit lines and word lines wired in a lattice form. A normal TMR element has a ferromagnetic layer/nonmagnetic insulating layer/ferromagnetic layer, three-layer structure having a nonmagnetic layer between two ferromagnetic layers. The ferromagnetic layers are normally made of a magnetic transition metal element (Fe, Co, Ni) or an alloy of magnetic transition metal elements (CoFe, CoFeNi, NiFe, or the like), and the nonmagnetic insulating layer is made of $Al_2O_3$, MgO, or the like.

One of the ferromagnetic layers (pinned layer) forming the TMR element is fixed in the direction of magnetization, while the other ferromagnetic layer (magnetosensitive layer or free layer) is turned in the direction of magnetization according to an external magnetic field. As a structure of the pinned layer, an exchange coupling type for which an antiferromagnetic layer (FeMn, IrMn, PtMn, NiMn, or the like) is given to one ferromagnetic layer is often used.

Memory information "1" or "0" is prescribed according to a state of the direction of magnetization of two ferromagnets forming the TMR element, that is, depending on whether the direction of magnetization is parallel or antiparallel. When the direction of magnetization of these two ferromagnets is antiparallel, the value of electrical resistance in the thickness direction is larger than that when the direction of magnetization is parallel.

Accordingly, the "1" or "0" information is read out by supplying current in the thickness direction of the TMR element and measuring a resistance value or a current value of the TMR element owing to an MR (magnetic resistance) effect.

It has been conventionally proposed to write "1" or "0" information by turning the direction of magnetization of the magnetosensitive layer of the TMR element by an effect of a magnetic field formed as a result of supplying current to wiring disposed in the vicinity of the TMR element, however, in recent years, a writing method by spin injection has also come to be known.

A nonvolatile random access memory unit described in Patent Document 1 (Japanese Published Unexamined Patent Application No. H11-120758) is constructed by arranging memory cells whose memory state can be switched over by an injection of spin-polarized electrons. The memory cells are concretely formed of, for example, a first ferromagnetic layer and a second ferromagnetic layer stacked via a paramagnetic layer, wherein the direction of magnetization of the first ferromagnetic layer is fixed, and the memory state is switched over by the direction of magnetization of the second ferromagnetic layer. That is, this memory unit has been applied with a propagation theory of a spin-polarized electron flow as a new technology for storing information in magnetic memory cells, and can be assembled in arrays of multi-level metal devices. Memory states in the individual cells correspond to one of the two stable orientations of magnetization in the plane of a ferromagnetic film switching layer. These states can be switched by injecting a spin-polarized electron flow into the storage cells. It has been described in the same document that this makes it possible to greatly increase recording density and thus the reading time can be shortened and power consumption can be reduced.

It has been described in Non-Parent Patent Document 1 ("Spin-torque transfer in batch-fabricated spin-value magnetic nanojunctions," J. Appl. Phys., May 15, 2003, Vol. 93, Number 10, pp. 6859-6863) that a two-terminal spin injection device could be manufactured by a process using a Co—Cu—Co stack. It has been described in the same document that the stack has been deposited by a sputtering method and electron beam evaporation.

In Non-Parent Document 2 ("Spin Pumping in Ferromagnetic-Metal/Normal-Metal Junctions," Journal of the Magnetic Society of Japan, 2003, Vol. 27, No. 9, pp. 934-939), a spin injection magnetization reversal has been described. When a spin-polarized current is injected into a ferromagnet, a magnetization precession and reversal occurs, and this phenomenon is called a spin injection magnetization reversal. When a bias current is vertically supplied to the film surface of a multilayer film of a first ferromagnet, a first nonmagnet, a second ferromagnet, and a second nonmagnet, a spin-polarized current flows. The spin-polarized current is a current flow accompanied with a spin flow. When the first and second ferromagnets are different in the direction of magnetization, a spin torque by a spin current works on magnetization of the second ferromagnet. This spin torque serves as a driving force to cause a magnetization motion. The spin injection magnetization reversal can be applied to a writing technique in an MRAM.

When the magnetization reversal using a spin injection is applied to a magnetic memory, a writing current can be reduced.

SUMMARY OF THE INVENTION

However, in spin injection recording for recording data by carrying out a magnetization reversal of a magnetosensitive layer by a current that flows vertically to the film surface of a magnetoresistance effect element, current necessary for a magnetization reversal is presently $1 \times 10^8 \sim 1 \times 10^6$ $A/cm^2$, where there is still room for improvement. That is, the TMR element has a relatively high resistance, and when a writing current is supplied thereto, there is a problem such that heat generation in a TMR element portion increases, and a breakdown due to voltage application occurs in some cases. That is, the smaller the current necessary for writing is, the more preferable it is.

When recording density is increased, the current necessary for a magnetization reversal is reduced in inverse proportion to the area of the TMR element. Therefore, by increasing recording density, a writing current can be lowered.

However, when the current necessary for writing is reduced, there is a possibility that a magnetization reversal occurs accidentally due to a current supplied when reading out information. In order to prevent a magnetization reversal from occurring due to a reading current, it has been considered to be necessary to make the reading current considerably small in comparison with the writing current. However, in this case, there is a concern that the function to read out information itself can be impaired, and thus it becomes difficult to increase the memory in density. That is, it has become necessary to drastically improve the magnetic memory.

The present invention has been made in view of such problems, and it is an object to provide a magnetic memory that can be improved in recording density.

In order to solve the problems described above, a magnetic memory according to the present invention is a magnetic memory formed by arranging a plurality of storage areas, wherein each storage area includes: first wiring for supplying a writing current; second wiring for supplying a reading current; common wiring; a magnetoresistance effect element; and a spin filter provided on the magnetoresistance effect element.

Here, the magnetoresistance effect element is located between the first wiring and the common wiring, is located between the second wiring and the common wiring, is electrically connected to the common wiring, is electrically connected to the first wiring via the spin filter, and is electrically connected to the second wiring without the spin filter.

When a writing current is supplied between the first wiring for supplying a writing current and the common wiring via the spin filter, a spin polarized current is injected into the magnetoresistance effect element, and when this current exceeds a magnetization reversal threshold value, a magnetosensitive layer of the magnetoresistance effect element is easily magnetization-reversed, and information is written. On the other hand, when a reading current is supplied between the second wiring for supplying a reading current and the common wiring, since this is not supplied via the spin filter, no spin polarized current is supplied into the magnetoresistance effect element, so that it becomes difficult to magnetization-reverse the magnetosensitive layer.

Therefore, even in a structure where the magnetosensitive layer is reduced in area so as to lower the writing current, no magnetization reversal occurs due to a supply of the reading current, and information can be read out without making the reading current considerably small in comparison with the writing current.

Moreover, the spin filter of each storage area has: a nonmagnetic conductive layer provided on the magnetoresistance effect element; and a pinned layer in contact with the nonmagnetic conductive layer, and the first wiring is provided on a first region on the pinned layer, and the second wiring is provided on a second region adjacent to the first region of the nonmagnetic conductive layer.

Since the first region and the second region are adjacent, a channel that connects the first wiring and the common wiring and a channel that connects the second wiring and the common wiring can be overlapped at a position of the magnetosensitive layer, and thus a writing and reading operation can be realized by a simple structure.

Moreover, in each storage area, between the first region and the second region, a step is interposed, and a margin region where neither the first wiring nor the second wiring is formed exists.

It is necessary that the first wiring and the second wiring are electrically separated since these are different in functions. Since the first wiring and the second wiring are interposed with the step and the margin region exists therebetween, there is an advantage that the first wiring and the second wiring are not easily short-circuited.

Moreover, each storage area further includes a second spin filter interposed between the magnetoresistance effect element and the common wiring. In this case, since two spin filters are interposed between the first wiring and the common wiring, filtering performance of spinning electrons to be injected into the magnetoresistance effect element can be improved, and thus the writing current can further be lowered.

Moreover, an area S2 of the second region is equal to or less than 50% of an area S1 of the first region. When the area S2 of the second region on which the second wiring is provided is large, the area of the spin filter layer is limited, and the area of a ferromagnetic layer PN1 is reduced, so that shape anisotropy in the magnetization direction decreases to impair stability in the magnetization direction. In addition, a spin polarized current that flows to the magnetoresistance effect element results in an uneven density distribution. For the above reasons, magnetization reversal efficiency is degraded, and the magnetization reversal threshold value increases, so that the area S2 is preferably small. However, if the area S2 is too small, the reading current is limited.

According to the magnetic memory of the present invention, even when the magnetosensitive layer that can be magnetization-reversed is reduced in area so as to reduce the writing current, it is not necessary to considerably lower the reading current, and thus recording density can be improved.

BRIEF DESCRIPTION OF THE DRAWINGS

FIG. 2A shows a longitudinal sectional view of a magnetoresistance effect element MR (with a parallel direction of magnetization).

FIG. 2B shows a longitudinal sectional view of a magnetoresistance effect element MR (with an antiparallel direction of magnetization).

DESCRIPTION OF THE PREFERRED EMBODIMENTS

Hereinafter, a magnetic memory according to an embodiment will be described. Here, identical elements are designated with identical numerical symbols so as to avoid overlapping descriptions. The magnetic memory according to the embodiment is formed by arranging X-rows and Y-columns of a plurality of storage areas P (X, Y), and each storage area P (X, Y) includes a magnetoresistance effect element MR.

Figure 1:
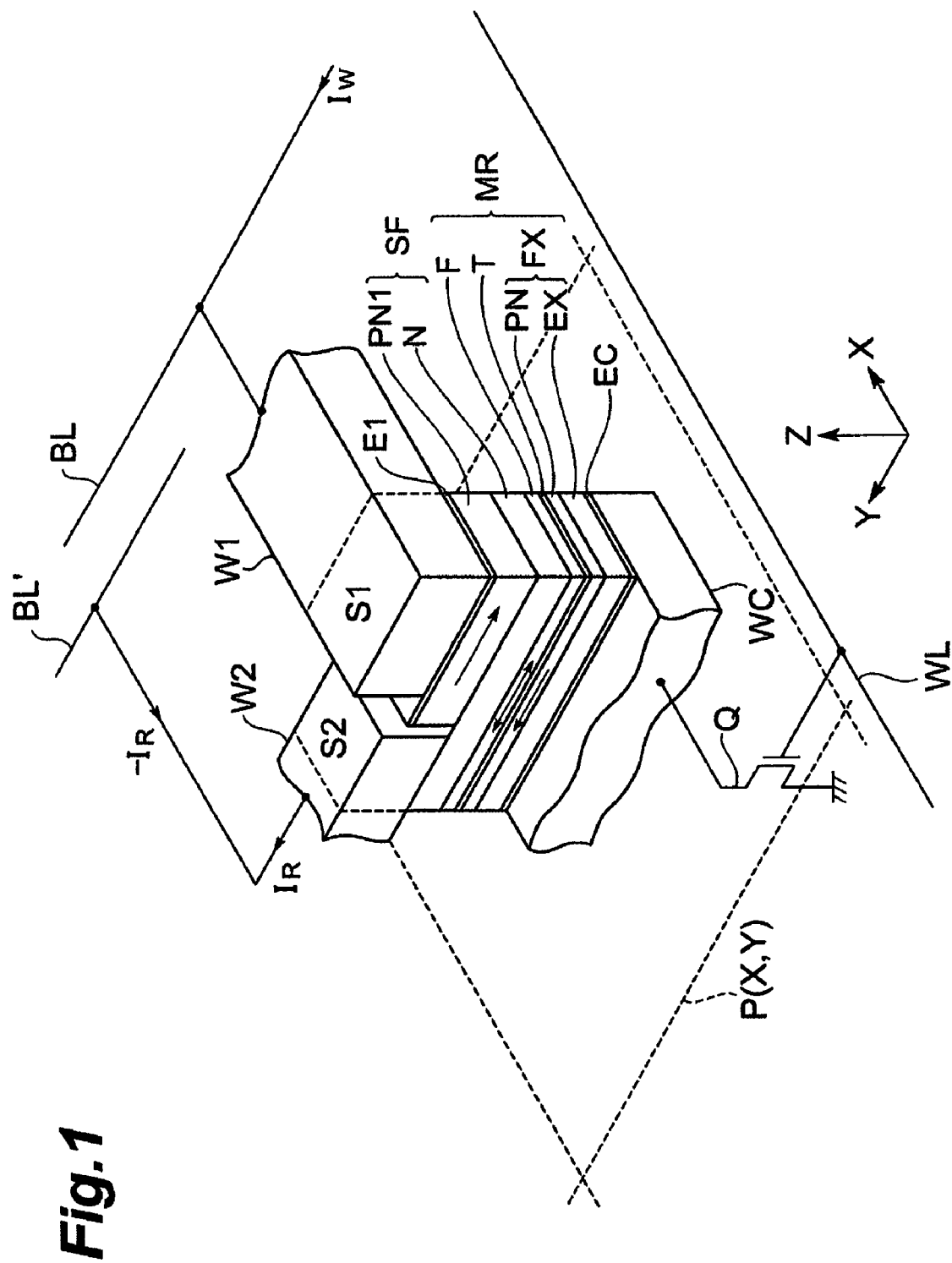
FIG. 1 is a perspective view of one storage area P (X, Y).

FIG. 1 is a perspective view of one storage area P (X, Y).

Each storage area P (X, Y) includes first wiring W1 for supplying a writing current $I_W$, second wiring W2 for supplying a reading current $I_R$, common wiring WC, a magnetoresistance effect element MR, and a spin filter SF provided on the magnetoresistance effect element MR.

The magnetoresistance effect element MR is a TMR element including an insulating layer T between magnetosensitive layer F and a pinned layer FX. The TMR element is an element using a phenomenon that the ratio of electrons passing through the insulating layer T serving as a tunnel barrier layer when reading out stored information is different according to a difference between the direction of magnetization of the magnetosensitive layer F and the direction of magnetization of the pinned layer FX, and this can carry out a highly sensitive detection of stored information. The direction of magnetization of the pinned layer FX is fixed by an antiferromagnetic layer EX exchange-coupled thereto.

The spin filter SF has a nonmagnetic conductive layer N provided on the magnetoresistance effect element MR and a first pinned layer PN1 being in contact with the nonmagnetic conductive layer N, and has a function to penetrate or reflect electrons spinning with a specific polarity and accumulate electrons spinning with the polarity in the magnetosensitive layer F of the magnetoresistance effect element MR. When the accumulation amount of spinning electrons exceeds a magnetization reversal threshold value of the magnetosensitive layer F, a magnetization reversal occurs. A first electrode layer E1 is interposed between the spin filter SF and the first wiring W1, and a common electrode layer EC is interposed between the antiferromagnetic layer EX and the common wiring WC.

The first wiring W1 is connected to a writing bit line BL for supplying a writing current $I_W$, and the second wiring W2 is connected to a reading bit line BL' for supplying a reading current $I_R$. The common wiring WC is connected to a reference potential via a switching transistor Q, and a gate of the transistor Q is connected to a word line WL.

When potential of the word line WL is provided at a specific level to turn on the switching transistor Q with potential of the writing bit line BL having been made higher than the reference potential, a writing current $I_W$ flows between the first wiring W1 and the transistor Q, electrons spinning with a specific polarity are injected into the magnetosensitive layer F, and for example, "1" is written. When potential of the word line WL is provided at a specific level to turn on the switching transistor Q with potential of the writing bit line BL having been made lower than the reference potential, a writing current $I_W(-)$ flows between the first wiring W1 and the transistor Q, electrons spinning with an opposite polarity to the above are injected into the magnetosensitive layer F, and for example, "0" is written.

The magnetoresistance effect element MR is located between the first wiring W1 and the common wiring WC, and is electrically connected to the first wiring W1 via the spin filter SF. The magnetoresistance effect element MR is electrically connected to the common wiring WC. When a writing current $I_W$ is supplied between the first wiring W1 for supplying a writing current $I_W$ and the common wiring WC via the spin filter SF, a spin polarized current is injected into the magnetoresistance effect element MR, and when this current exceeds a magnetization reversal threshold value, the magnetosensitive layer F of the magnetoresistance effect element MR is easily magnetization-reversed, and information is written.

On the other hand, the magnetoresistance effect element MR is also located between the second wiring W2 and the common wiring WC. The magnetoresistance effect element MR is electrically connected to the second wiring W2 without the spin filter SF. When a reading current $I_R$ is supplied between the second wiring W2 for supplying a reading current $I_R$ and the common wiring WC, since this is not supplied via the spin filter SF, no spin polarized current is supplied into the magnetoresistance effect element MR, so that it becomes difficult to magnetization-reverse the magnetosensitive layer F.

Therefore, even in a structure where, in order to improve recording density, the magnetosensitive layer F is reduced in area so as to lower the writing current $I_W$, no magnetization reversal occurs due to a supply of the reading current $I_R$, and information can be read out without making the reading current $I_R$ considerably small in comparison with the writing current $I_W$.

The second wiring W2 is connected to the reading bit line BL', and when potential of the word line WL is provided at a specific level to turn on the switching transistor Q with potential of the reading bit line BL' having been made higher than the reference potential, a reading current $I_R$ flows between the second wiring W2 and the transistor Q, and stored information is read out according to the direction of magnetization of the magnetosensitive layer F.

FIG. 2A shows a longitudinal sectional view of the magnetoresistance effect element MR (with a parallel direction of magnetization), and FIG. 2B shows a longitudinal sectional view of the magnetoresistance effect element MR (with an antiparallel direction of magnetization).

The magnetoresistance effect element MR has a structure where an insulating layer T forming a tunnel barrier layer is sandwiched by a magnetosensitive layer F and a pinned layer FX. The pinned layer FX includes a ferromagnetic layer PN and an antiferromagnetic layer EX joined with the ferromagnetic layer PN to fixate the direction of magnetization.

Memory information "1" or "0" is prescribed according to a state of direction of magnetization of a ferromagnetic layer (pinned layer) PN and the magnetosensitive layer F forming the TMR element, that is, depending on whether the direction of magnetization is parallel (FIG. 2A) or antiparallel (FIG. 2B). When the direction of magnetization of the ferromagnetic layer PN and the magnetosensitive layer F is antiparallel (FIG. 2B), the value of electrical resistance R in the thickness direction is larger than that when the direction of magnetization is parallel (FIG. 2A). In other words, resistance R when the direction of magnetization is parallel is equal to or less than a threshold value R0, and resistance R when the direction of magnetization is antiparallel is larger than the threshold value R0. Accordingly, the "1" or "0" information is read out by supplying a current $I_R$ in the thickness direction of the TMR element and measuring a resistance value or a current value of the TMR element owing to an MR (magnetic resistance) effect. For example, a parallel state with a low resistance is provided as "0," and an antiparallel state with a high resistance is provided as "1."

Figure 3:
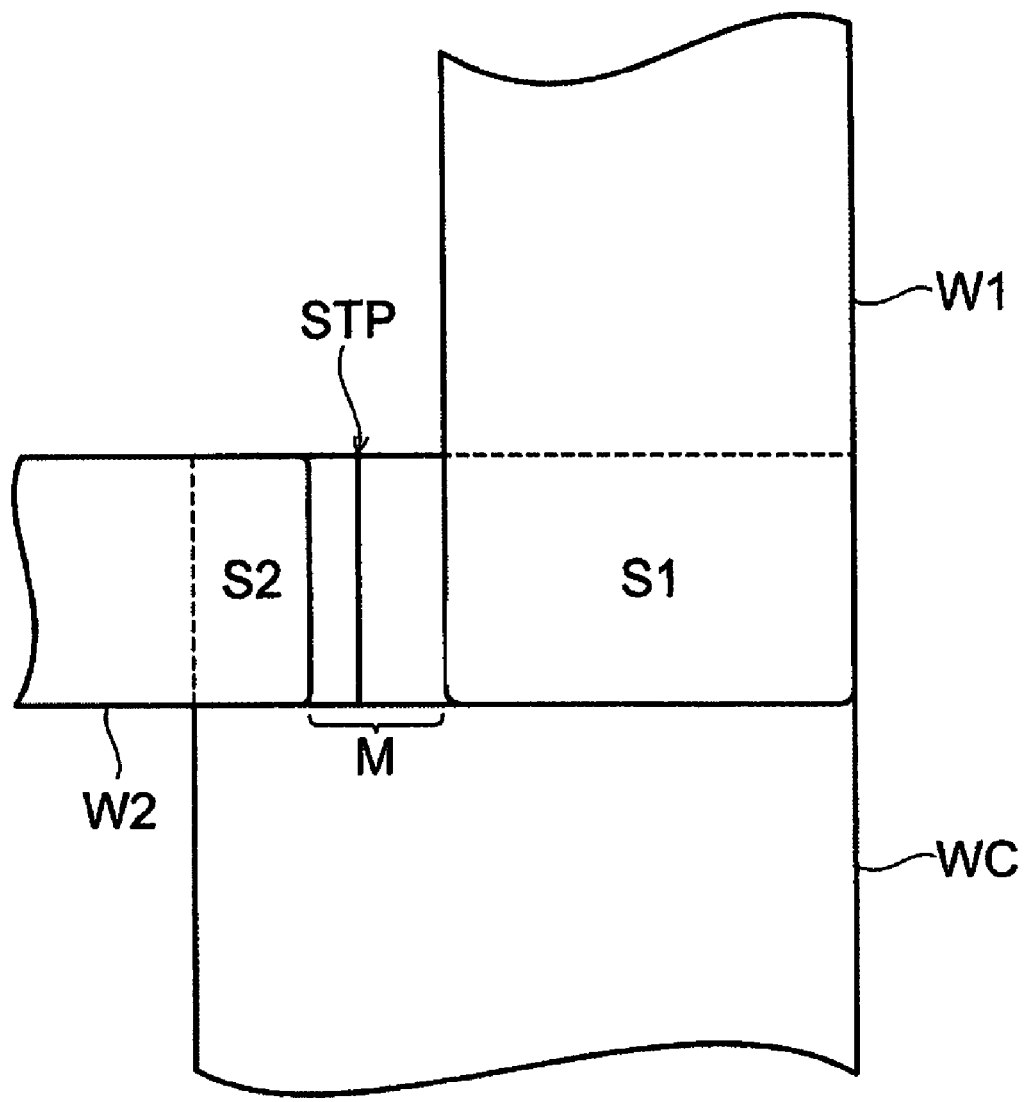
FIG. 3 is a plan view of a storage area P (X, Y).

FIG. 3 is a plan view of a storage area P (X, Y).

The spin filter SF of each storage area P (X, Y) has a nonmagnetic conductive layer N provided on the magnetoresistance effect element MR and a first pinned layer PN1 being in contact with the nonmagnetic conductive layer N, the first wiring W1 is provided on a first region S1 of the pinned layer PN1, and the second wiring W2 is provided on a second region S2 adjacent to the first region S1 of the nonmagnetic conductive layer N. Here, for the sake of simplification of description, the first region S1 and the second region S2 are designated with numerical symbols identical to their respective regions S1 and S2.

Since the first region S1 and the second region S2 are adjacent, a channel that connects the first wiring W1 and the common wiring WC and a channel that connects the second wiring W2 and the common wiring WC can be overlapped at a position of the magnetosensitive layer F, and thus a writing and reading operation can be realized by a simple structure.

Moreover, in the each storage area P (X, Y), between the first region S1 and the second region S2, a step is interposed, and a margin region M where neither the first wiring W1 nor the second wiring W2 is formed exists. It is necessary that the first wiring W1 and the second wiring W2 are electrically separated since these are different in functions. Since the first wiring W1 and the second wiring W2 are interposed with the step STP and the margin region M exists therebetween, there is an advantage that the first wiring W1 and the second wiring W2 are not easily short-circuited.

Moreover, it is preferable that the area S2 of the second region is equal to or less than 50% of the area S1. When the area S2 of the second region on which the second wiring is provided is large, the area of the spin filter layer is limited, and the area of the ferromagnetic layer PN1 is reduced, so that shape anisotropy in the magnetization direction is reduced to impair stability in the magnetization direction. In addition, a spin polarized current that flows to the magnetoresistance effect element results in an uneven density distribution. For the above reasons, magnetization reversal efficiency is degraded, and the magnetization reversal threshold value increases, so that the area S2 is preferably small. However, if the area S2 is too small, the reading current is limited.

Constituent materials of the above-described components are as follows.

As a material of the magnetosensitive layer F, a ferromagnetic material such as, for example, Co, CoFe, NiFe, NiFeCo, CoPt, or CoFeB can be used. The magnetosensitive layer F can change the magnetization direction while being assisted by a current that flows through the first wiring W1 and a magnetic field around the current, and the smaller the area of the magnetosensitive layer F is, the smaller a current (threshold value of current) necessary for a magnetization reversal can be made. The direction of magnetization of the magnetosensitive layer F is parallel to a Y-axis direction. The area of the magnetosensitive layer F is preferably 0.01 $\mu m^2$ or less. If the area of the magnetosensitive layer F exceeds 0.01 $\mu m^2$, since the threshold current value necessary for a magnetization reversal increases, it becomes difficult to record information. Furthermore, for the magnetosensitive layer F, the smaller the thickness is, the smaller the threshold value of current for a magnetization reversal can be made. The thickness of the magnetosensitive layer F is preferably 0.01 $\mu m$ or less. If the thickness exceeds 0.01 $\mu m$, the current value necessary for a magnetization reversal increases, so that it becomes difficult to record information.

As a material of the nonmagnetic insulating layer T, an oxide or a nitride of metal such as Al, Zn, or Mg, for example, $Al_2O_3$ or MgO is preferred. As a structure of the pinned layer FX, an exchange coupling type for which an antiferromagnetic layer is given to a ferromagnetic layer can be used, and the direction of magnetization of the ferromagnetic layer is fixed to a +Y-direction. As a material of the ferromagnetic layer PN, the above-described material can be used. In addition, as a material of the antiferromagnetic layer EX, a material of IrMn, PtMn, FeMn, NiMe, PtPdMn, RuMn, NiO, or an arbitrary combination of these can be used. As a material of the nonmagnetic conductive layer N and the electrode layers E1 and EC, Cu or Ru can be used. As various types of wiring materials, Cu, AuCu, W, Al, etc., can be used. As a material of the first pinned layer PN1, the above-described ferromagnetic material can be used, and the direction of magnetization is fixed to a −Y-direction.

Next, description will be given of how the writing current $I_W$ and the reading current $I_R$ flow.

Figure 4:
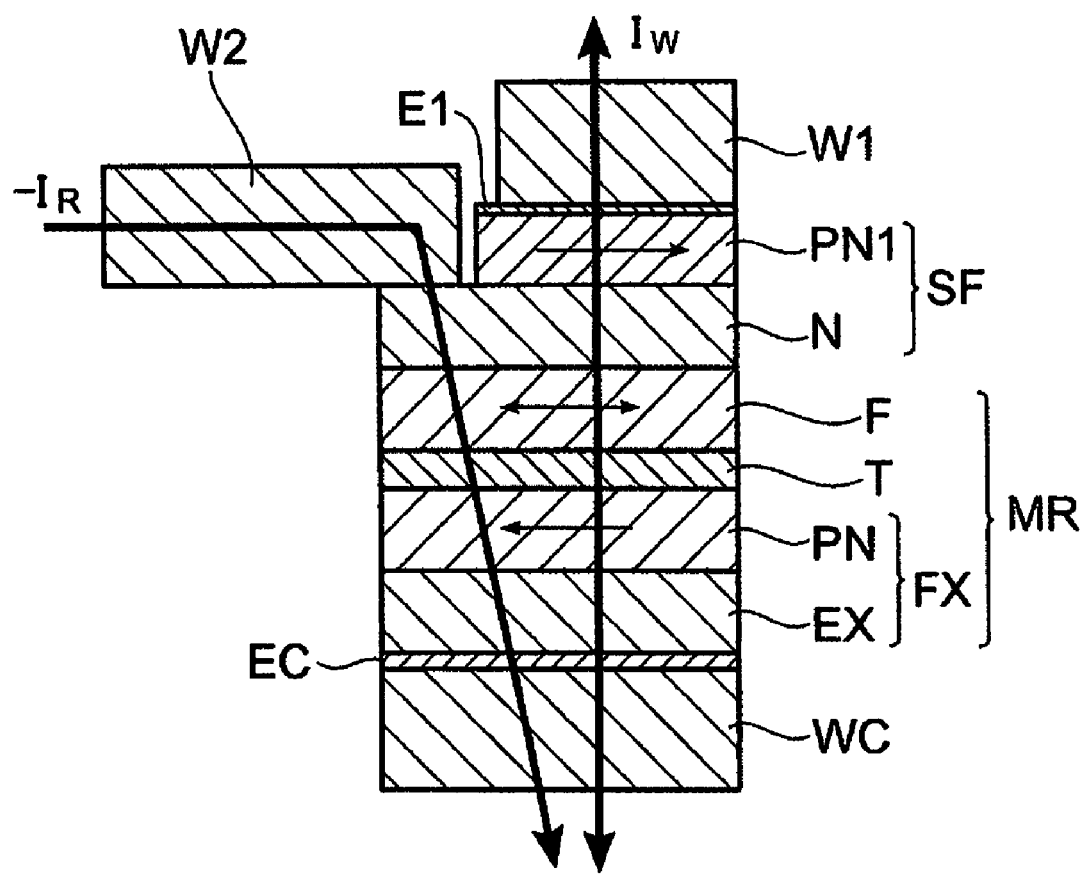
FIG. 4 is a longitudinal sectional view of a storage element including a magnetoresistance effect element MR.

FIG. 4 is a longitudinal sectional view of a storage element including a magnetoresistance effect element MR.

The writing current $I_W$ flows between the first wiring W1 and the common wiring WC. That is, electrons having a specific spin included in the writing current $I_W$ pass through the first electrode layer E1 and the spin filter SF, and the remaining spinning electrons are reflected, and the passed electrons flow into the magnetosensitive film F, and then pass through the nonmagnetic insulating layer T, the ferromagnetic layer PN, the antiferromagnetic layer EX, and the common electrode layer EC and flow to the common wiring WC. In addition, when electrons flow in the opposite direction, electrons having a specific spin penetrate through the spin filter SF, and the remaining spinning electrons are reflected and flow into the magnetosensitive layer F.

The reading current $I_R$ flows between the second wiring W2 and the common wiring WC. That is, electrons (provided as $-I_R$) included in the reading current $I_R$ pass through the nonmagnetic conductive layer N partially common with the spin filter SF and flow into the magnetosensitive film F, but do not pass through the spin filter SF, and thus these flow into the magnetosensitive film F without being sorted out by their spin polarity. In other words, electrons having a specific spin are not accumulated in the magnetosensitive layer F, a spin injection magnetization reversal hardly occurs. The electrons induced in the magnetosensitive layer F pass through the nonmagnetic insulating layer T, the ferromagnetic layer PN, the antiferromagnetic layer EX, and the common electrode layer EC and flow to the common wiring WC.

Figure 5:
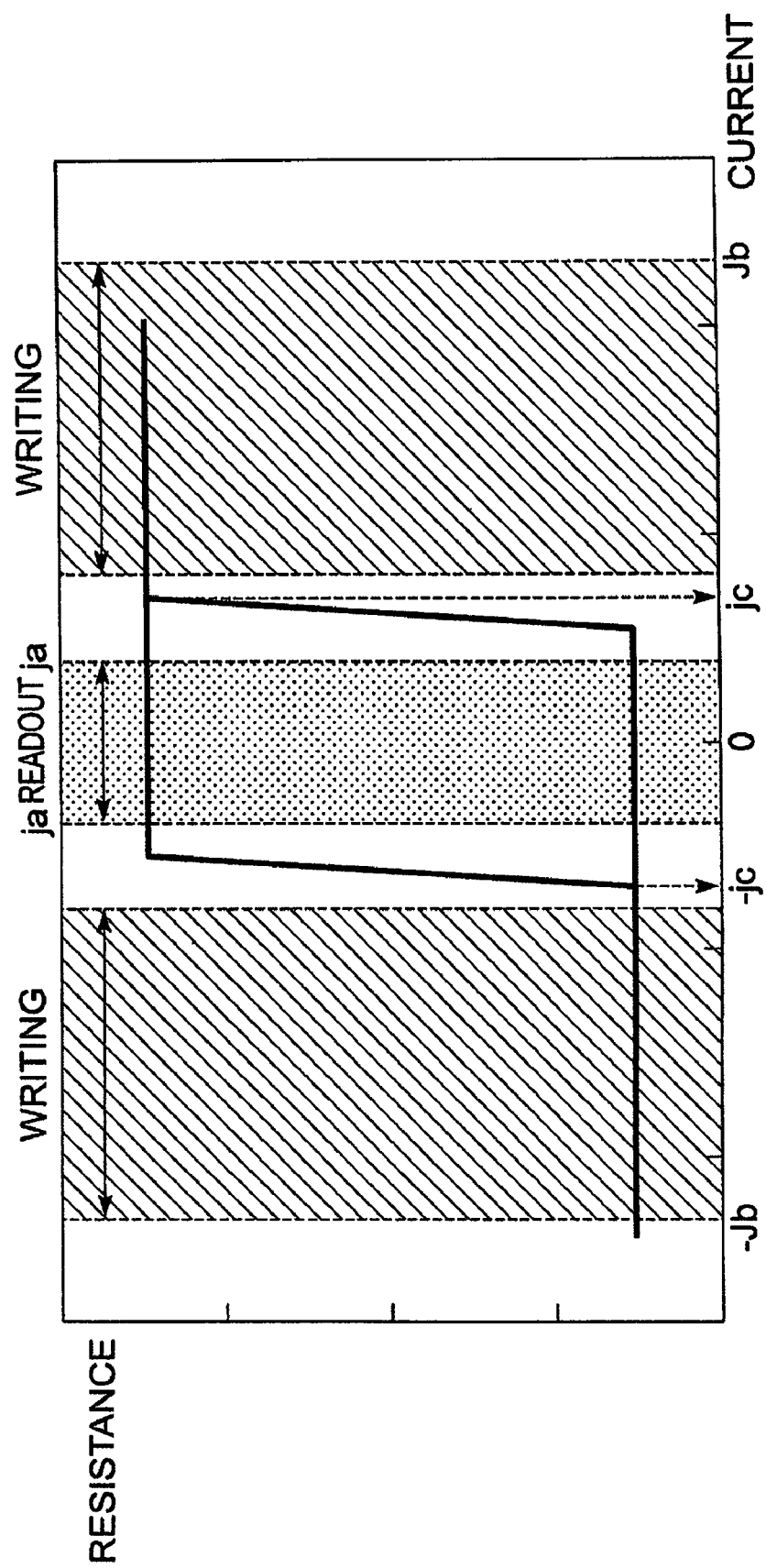
FIG. 5 is a graph showing a relationship between a current value supplied to a conventional magnetoresistance effect element MR and a resistance value of the magnetoresistance effect element MR.

FIG. 5 is a graph showing a relationship between a current value supplied to a conventional magnetoresistance effect element MR and a resistance value of the magnetoresistance effect element MR.

When an absolute value of the supplied current value exceeds a writing current threshold value jc, a magnetization reversal occurs and the resistance value suddenly changes, and writing of information different from current information is carried out. That is, when the supplied current value exceeds a positive writing current threshold value jc, the resistance value suddenly increases, and when it falls below a negative writing current threshold value −jc, the resistance value suddenly decreases. The absolute value of a current supplied when writing is equal to or more than the writing current threshold value jc. However, when the supplied current value exceeds a breakdown current value jb, an element breakdown occurs. That is, it is necessary to set the absolute value of the writing current. $I_W$ equal to or more than the writing current threshold value jc and equal to or less than the breakdown current value jb.

On the other hand, in order to prevent a magnetization reversal from occurring due to the reading current $I_R$ supplied when reading out information, an absolute value of the supplied current value is set equal to or less than a reading current threshold value ja obtained by subtracting a margin current from the writing current threshold value jc. When the current necessary for writing is reduced, there is a possibility that a magnetization reversal occurs accidentally due to a current supplied when reading out information, so that in order to prevent a magnetization reversal from occurring due to the reading current $I_R$, it is necessary to make the reading current considerably small in comparison with the writing current $I_W$. However, in this case, there is a concern that the function to read out information itself can be impaired, and thus it has been difficult to increase the memory in density.

Figure 6:
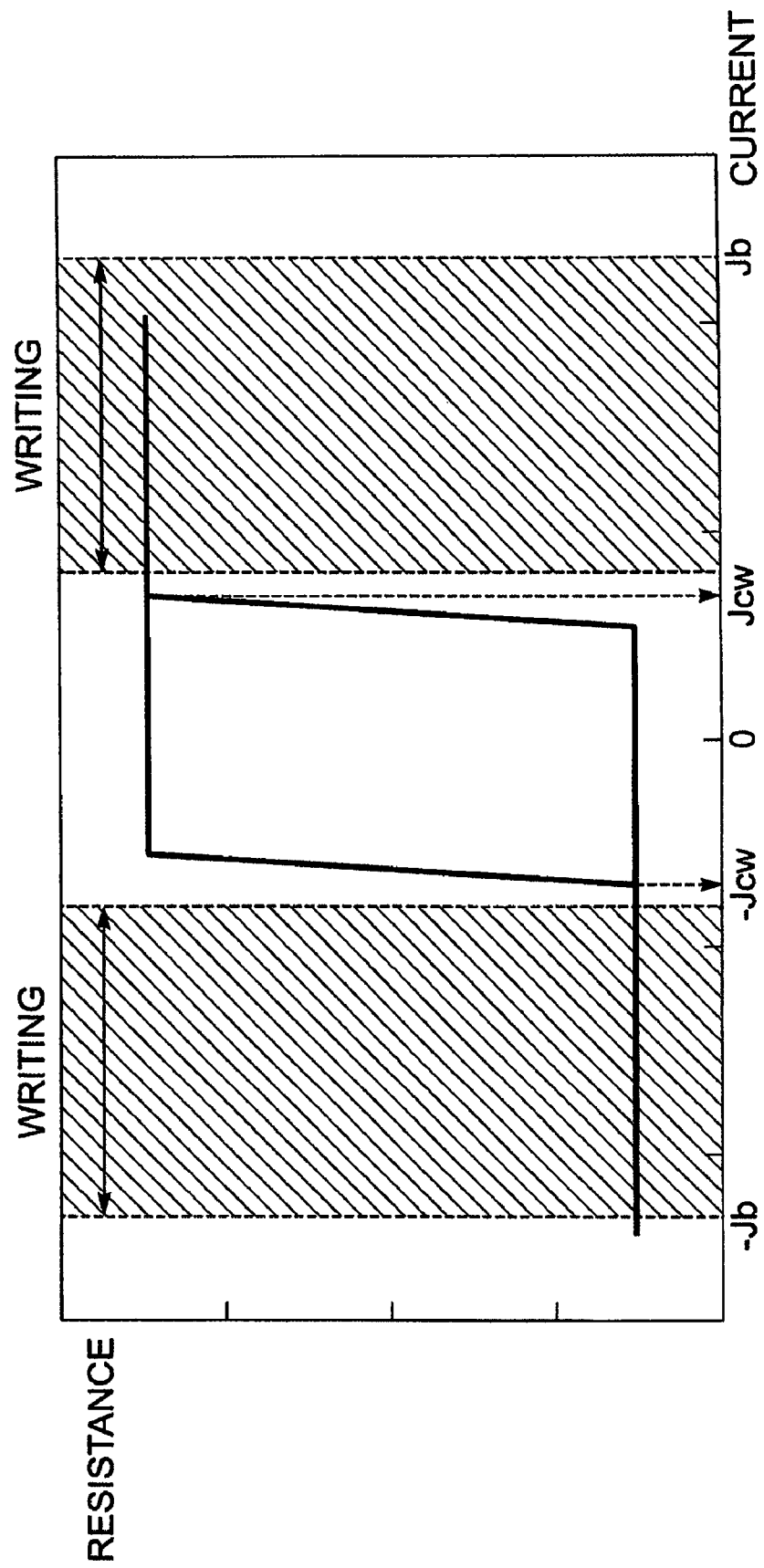
FIG. 6 is a graph showing a relationship between a current value of a writing current $I_W$ supplied to a magnetoresistance effect element MR according to the present embodiment and a resistance value of the magnetoresistance effect element MR.

FIG. 6 is a graph showing a relationship between a current value of a writing current $I_W$ supplied to a magnetoresistance effect element MR according to the present embodiment and a resistance value of the magnetoresistance effect element MR.

When an absolute value of the supplied current value exceeds a writing current threshold value jcw, a magnetization reversal occurs and the resistance value suddenly changes, and writing of information different from current information is carried out. That is, when the supplied current value exceeds a positive writing current threshold value jcw, the resistance value suddenly increases, and when it falls below a negative writing current threshold value −jcw, the resistance value suddenly decreases. The absolute value of a current supplied when writing is equal to or more than the writing current threshold value jwc. However, when the supplied current value exceeds a breakdown current value jb, an element breakdown occurs. That is, it is necessary to set the absolute value of the writing current $I_W$ equal to or more than the writing current threshold value jcw and equal to or less than the breakdown current value jb.

Figure 7:
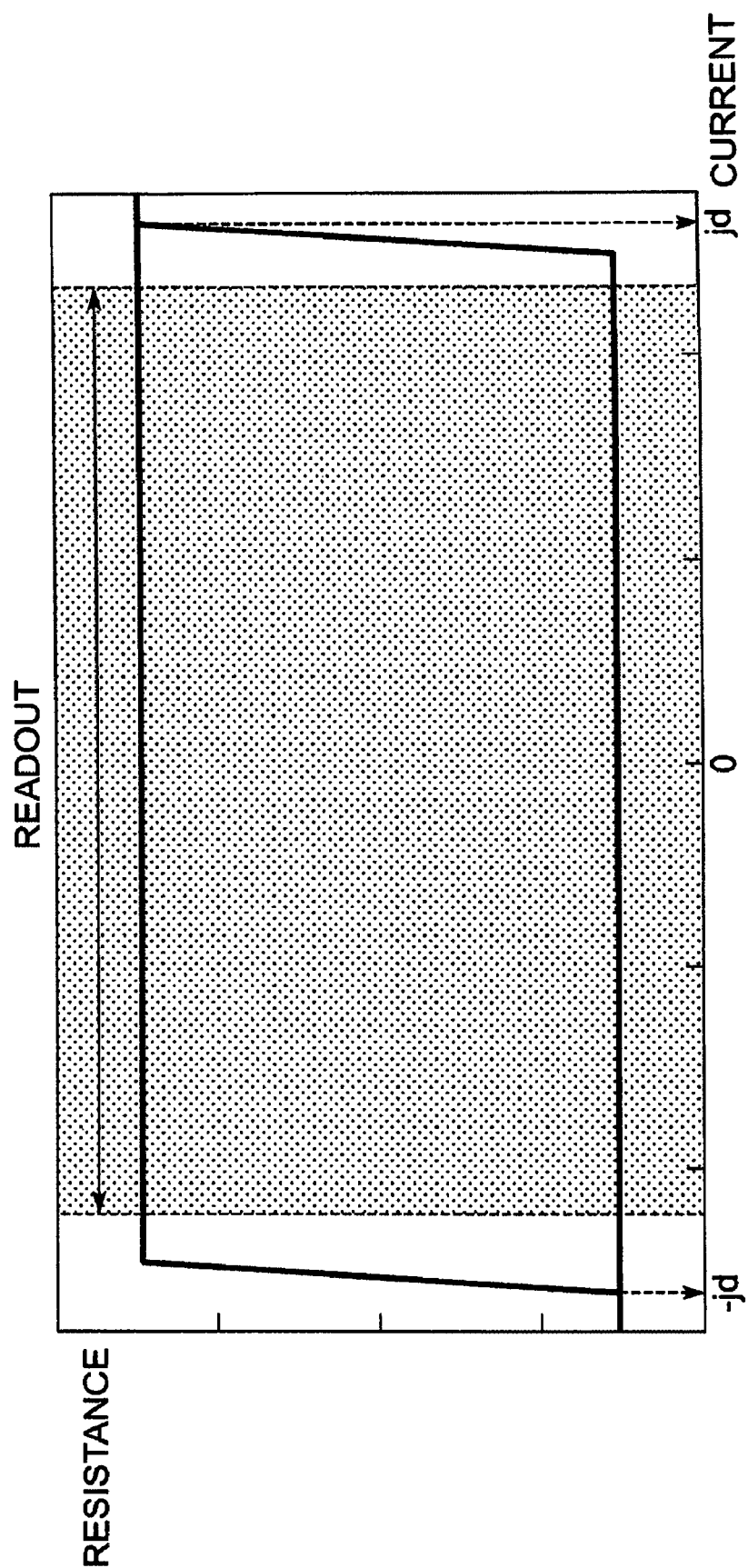
FIG. 7 is a graph showing a relationship between a current value of a reading current $I_R$ supplied to a magnetoresistance effect element MR according to the present embodiment and a resistance value of the magnetoresistance effect element MR.

FIG. 7 is a graph showing a relationship between a current value of a reading current $I_R$ supplied to a magnetoresistance effect element MR according to the present embodiment and a resistance value of the magnetoresistance effect element MR.

As described above, since the reading current $I_R$ does not flow via the spin filter SF, no spin polarized current is supplied into the magnetoresistance effect element MR, so that it becomes difficult to magnetization-reverse the magnetosensitive layer F. Therefore, as described above, even in a structure where the magnetosensitive layer F is reduced in area so as to lower the writing current $I_W$, no magnetization reversal occurs due to a supply of the reading current $I_R$, and information can be read out without making the reading current $I_R$ considerably small in comparison with the writing current $I_W$. An absolute value of the reading current $I_W$ is set equal to or less than a reading current threshold value jd where a magnetization reversal occurs and the resistance value suddenly changes.

In the case of a conventional example, an absolute value of the reading current $I_R$ has been set equal to or less than the reading current threshold value ja due to a restrictive condition for a magnetization reversal inhibition, while in the present embodiment, it is sufficient to set the absolute value equal to or less than jd (>>ja). Since there is no restrictive condition for a magnetization reversal inhibition, it is also possible to set the reading current threshold value jd equal to or more than the writing current threshold value jcw. When the reading current threshold value jd is equalized to the writing current threshold value jcw, the circuit structure can be simplified.

Next, description will be given of a manufacturing method of a storage element that includes the above-described magnetoresistance effect element MR.

FIG. 8A, FIG. 8B, FIG. 8C, FIG. 8D, FIG. 8E, FIG. 9A, FIG. 9B, FIG. 9C, FIG. 9D, FIG. 10A, FIG. 10B, FIG. 10C, FIG. 11A, FIG. 11B, and FIG. 11C are longitudinal sectional views of a storage element intermediate for explaining a manufacturing method of a storage element.

Figure 8A:
FIG. 8A is a longitudinal sectional view of a storage element intermediate for explaining a manufacturing method of a storage element.
Figure 8B:
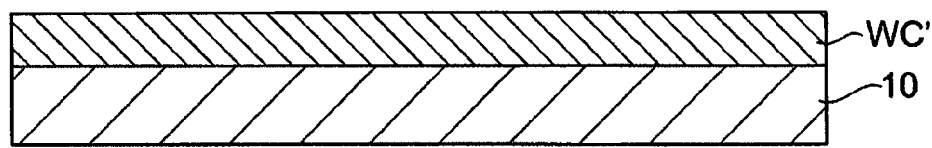
FIG. 8B is a longitudinal sectional view of a storage element intermediate for explaining a manufacturing method of a storage element.
Figure 8C:
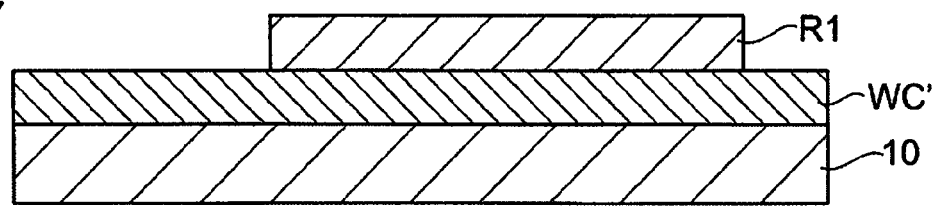
FIG. 8C is a longitudinal sectional view of a storage element intermediate for explaining a manufacturing method of a storage element.
Figure 8D:
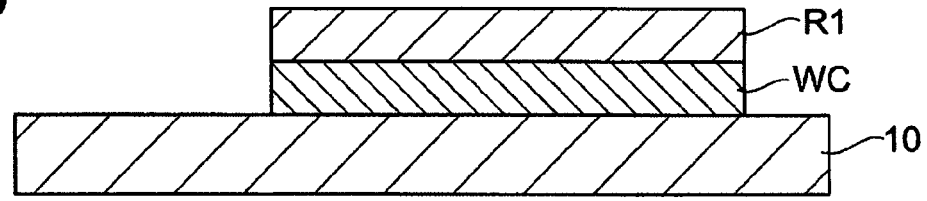
FIG. 8D is a longitudinal sectional view of a storage element intermediate for explaining a manufacturing method of a storage element.
Figure 8E:
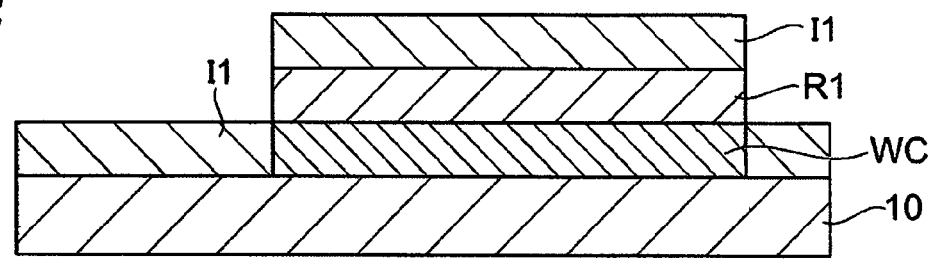
FIG. 8E is a longitudinal sectional view of a storage element intermediate for explaining a manufacturing method of a storage element.
Figure 9A:
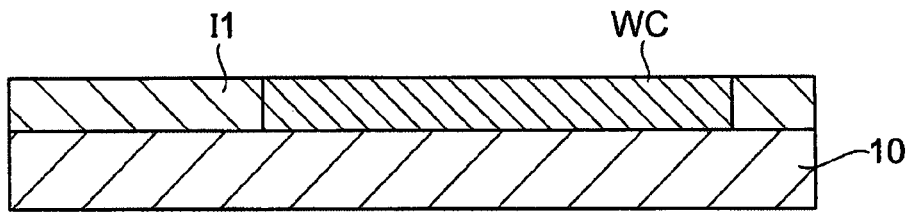
FIG. 9A is a longitudinal sectional view of a storage element intermediate for explaining a manufacturing method of a storage element.

First, a semiconductor substrate 10 made of silicon on which a circuit such as a transistor Q is formed is prepared (FIG. 8A). On the substrate 10 on which a semiconductor circuit has been formed, a metal layer WC' connected with vertical wiring (contact plug) of a semiconductor layer is formed. That is, in a manner connecting to vertical wiring of a semiconductor layer, a Ti layer, a Cu layer, and a Ti layer are stacked in sequence by a sputtering device to form a metal layer WC' (FIG. 8B). Then, in order to form a pattern, a photoresist R1 to be a mask is formed on the metal layer WC' by a lithography device (FIG. 8C), the metal layer WC' is etched by ion milling (FIG. 8D), whereby lower common wiring WC having a wiring pattern is formed. Subsequently, an insulating layer I1 such as $SiO_2$ is stacked on the exposed surface of the substrate by means of an RF sputtering device (FIG. 8E), and then, the photoresist R1 is removed (FIG. 9A).

Figure 9B:
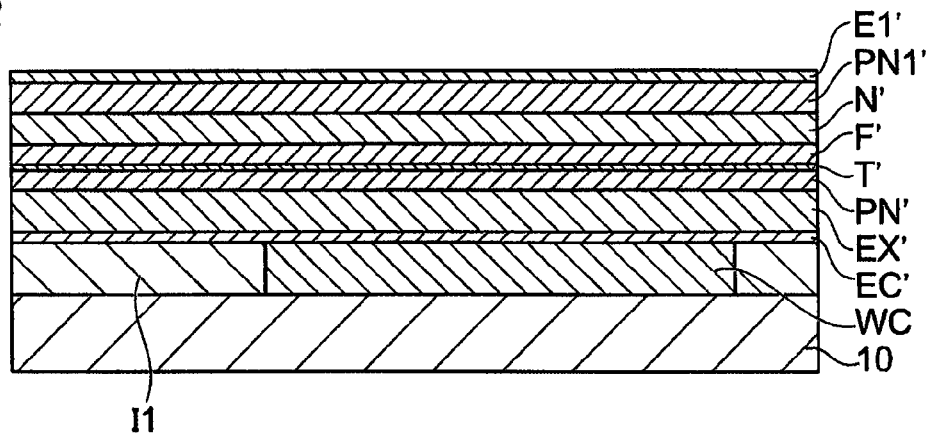
FIG. 9B is a longitudinal sectional view of a storage element intermediate for explaining a manufacturing method of a storage element.
Figure 9C:
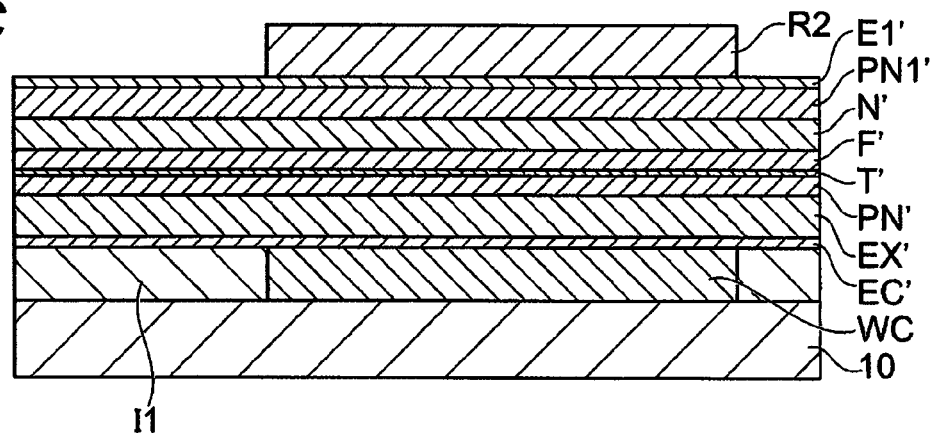
FIG. 9C is a longitudinal sectional view of a storage element intermediate for explaining a manufacturing method of a storage element.

Next, by a high-vacuum sputtering device, on the exposed surface of the substrate, a common electrode layer (Ta) EC', an antiferromagnetic layer (IrMn) EX', and a ferromagnetic layer (CoFe) PN' are formed, and subsequently, a nonmagnetic insulating layer T' is formed. For the nonmagnetic insulating layer T', Al is formed on the ferromagnetic layer PN', and then, the Al layer is oxidized by oxygen so as to provide $Al_2O_3$. A magnetosensitive layer (CoFe) F', a nonmagnetic conductive layer (Ru) N', a pinned layer (CoFe) PN1', and a first electrode layer (Ta) E1' are stacked in sequence (FIG. 9B). As a material of the magnetosensitive layer F and the ferromagnetic layer PN, for example, CoFeB may be used, and as a material of the nonmagnetic insulating layer T', MgO can be used.

Figure 9D:
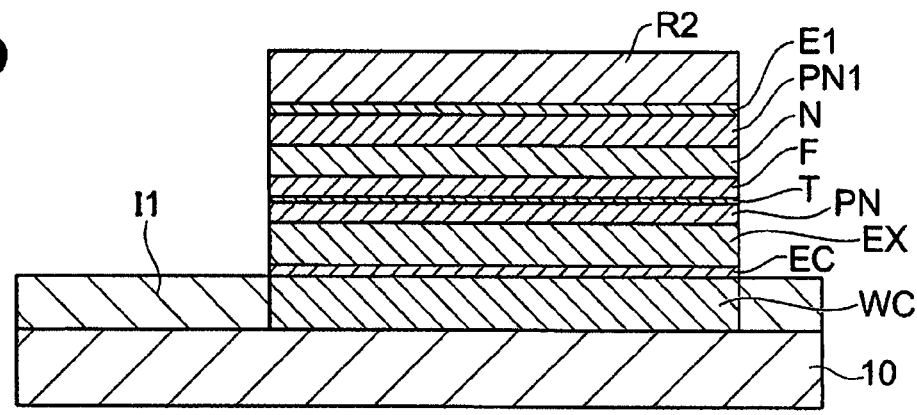
FIG. 9D is a longitudinal sectional view of a storage element intermediate for explaining a manufacturing method of a storage element.

Next, a photoresist R2 is formed on the first electrode layer E1' by a lithography device (FIG. 9C), and using this as a mask, the stacked magnetic layers are dry-etched. For this etching, ion milling is used. Thereby, a stack pattern of a TMR element is formed (FIG. 9D).

Figure 10A:
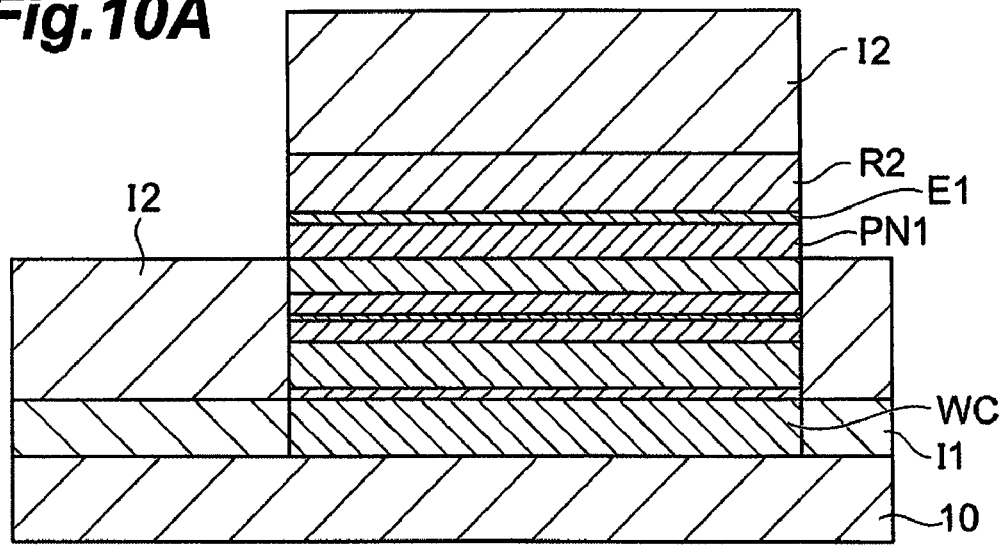
FIG. 10A is a longitudinal sectional view of a storage element intermediate for explaining a manufacturing method of a storage element.
Figure 10B:
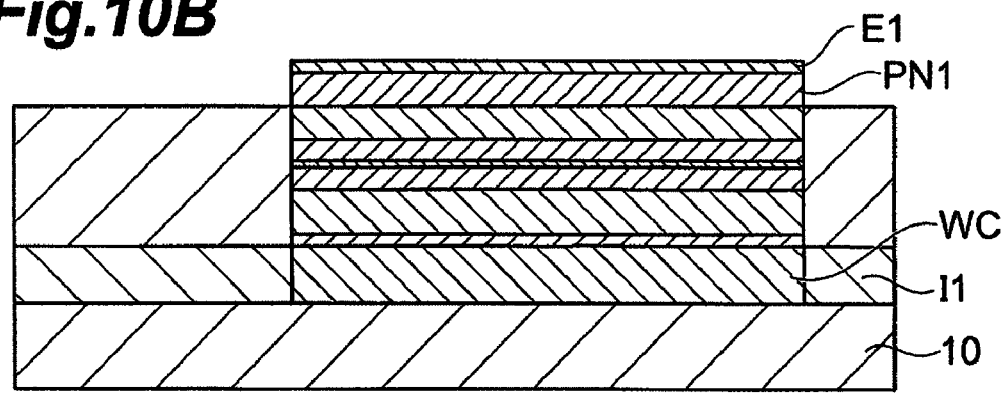
FIG. 10B is a longitudinal sectional view of a storage element intermediate for explaining a manufacturing method of a storage element.
Figure 10C:
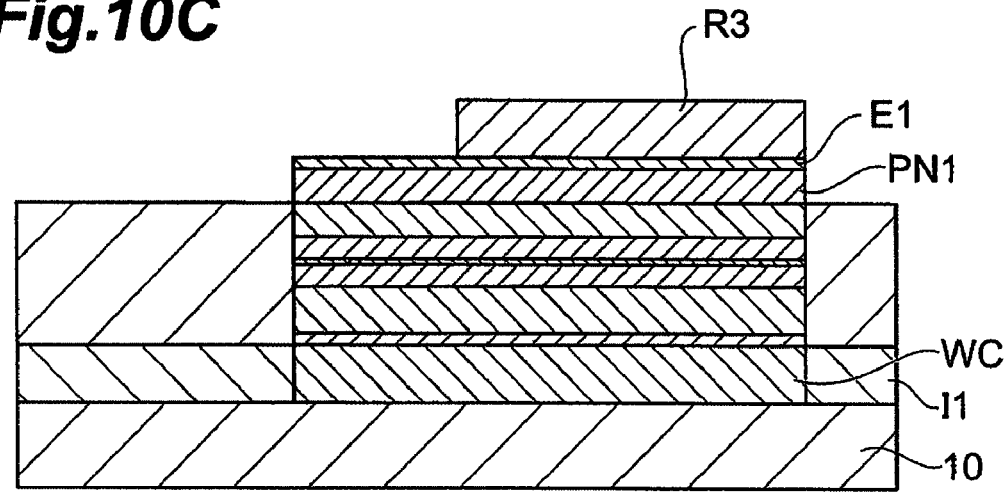
FIG. 10C is a longitudinal sectional view of a storage element intermediate for explaining a manufacturing method of a storage element.
Figure 11A:
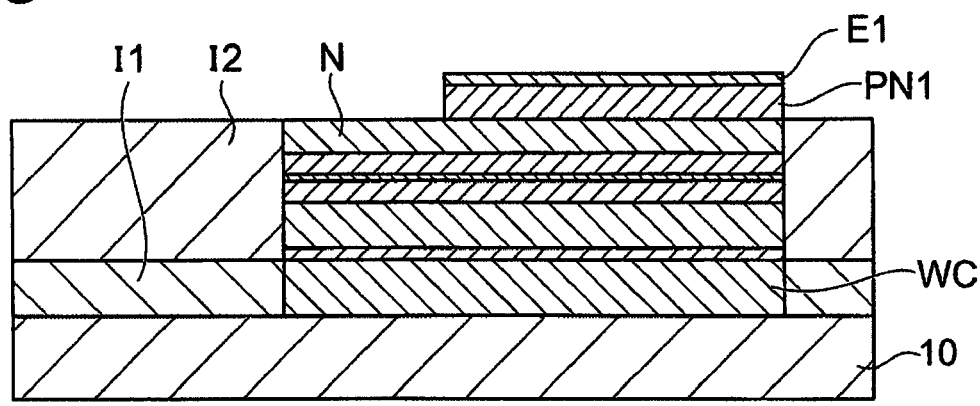
FIG. 11A is a longitudinal sectional view of a storage element intermediate for explaining a manufacturing method of a storage element.
Figure 11B:
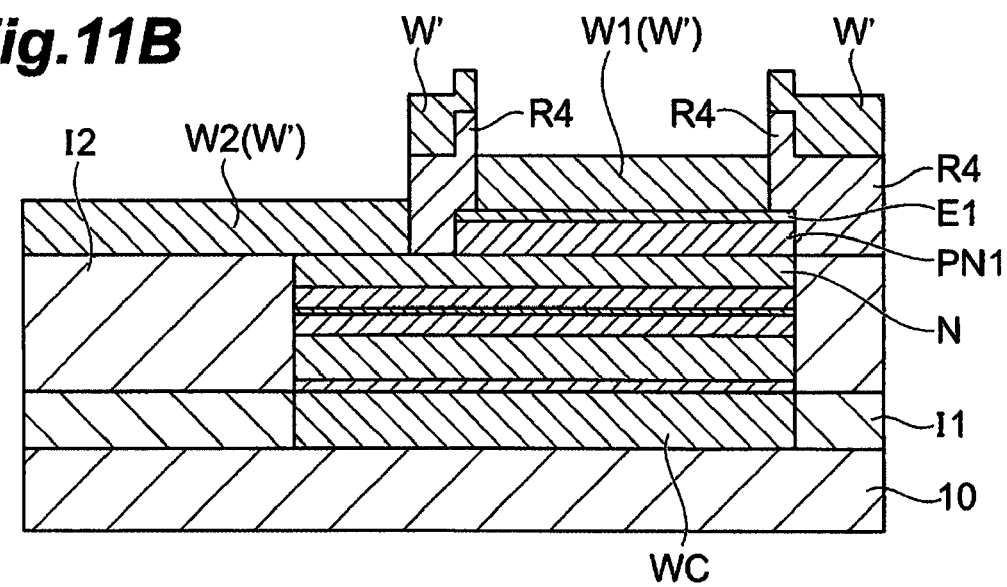
FIG. 11B is a longitudinal sectional view of a storage element intermediate for explaining a manufacturing method of a storage element.

Subsequently, an insulating layer I2 such as, for example, $SiO_2$ is deposited on the exposed surface of the substrate by a sputtering device (FIG. 10A), and then, the photoresist P2 is dissolved so as to remove the insulating layer I2 on the first electrode layer E1 by lift-off (FIG. 10B). Furthermore, on the first electrode E1, at a position opposed to the common wiring WC located underneath, a photoresist R3 is formed (FIG. 10C), and using this as a mask, a partial region of the first electrode layer E1 and the pinned layer PN1 is removed by ion milling, and then, the photoresist R3 is removed so as to expose a partial region of the nonmagnetic conductive layer N (FIG. 11A).

Figure 11C:
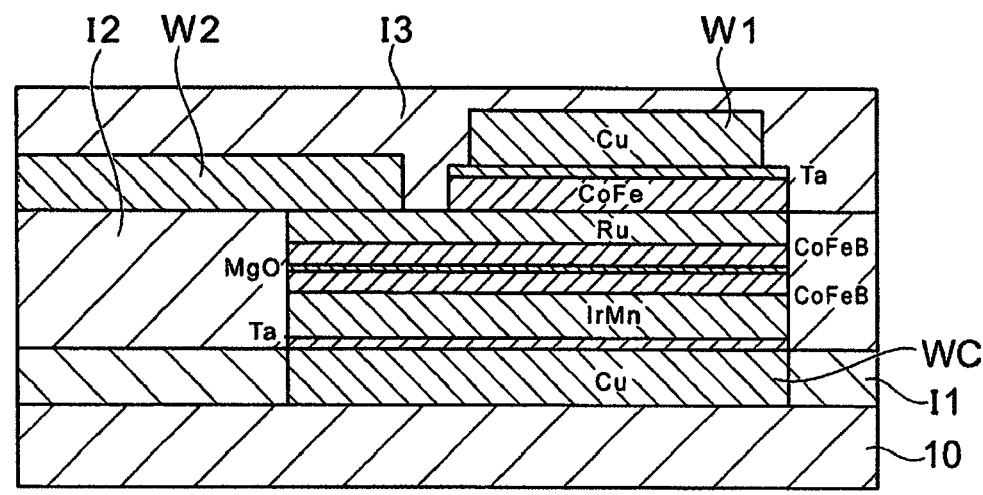
FIG. 11C is a longitudinal sectional view of a storage element intermediate for explaining a manufacturing method of a storage element.

Next, in order to form a pattern of a connecting portion between the second wiring W2 and the nonmagnetic conductive layer N, a photoresist R4 is formed so as to lie across a partial surface of the first electrode layer E1 and a partial surface of the nonmagnetic conductive layer N adjacent thereto via a step, thereon a metal layer (Cu) W' is formed by a sputtering device (FIG. 11B), and then the photoresist R4 is dissolved. By this lift-off, the metal layer at a boundary part between the first wiring W1 and the second wiring W2 is removed (FIG. 11C). The metal layer W' can also be provided as a stack composed of a Ti layer, a Cu layer, and a Ta layer. Then, by means of a CVD device, a protection layer I3 made of $SiO_2$ is formed on the exposed surface using, for example, $Si(OC_2H_5)_4$, thus a storage element is completed.

Figure 12:
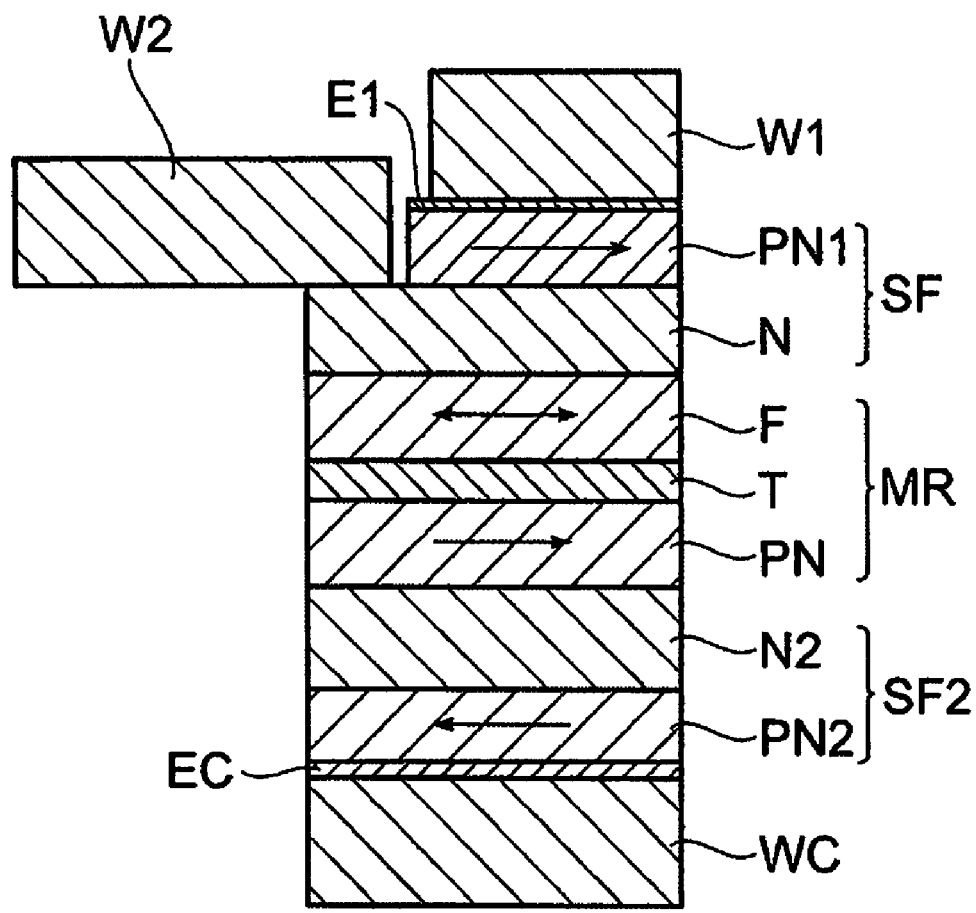
FIG. 12 is a longitudinal sectional view of a storage element of a magnetic memory according to another embodiment.

FIG. 12 is a longitudinal sectional view of a storage element of a magnetic memory according to another embodiment. In this storage element, a second spin filter SF2 formed by stacking a nonmagnetic conductive layer N2 and a ferromagnetic layer PN2 is used in place of the antiferromagnetic layer EX. At a common wiring WC side of the ferromagnetic layer PN, the nonmagnetic conductive layer N2 and the ferromagnetic layer PN2 are located in order. Each storage area P (X,Y) shown in FIG. 1 further includes the second spin filter SF2 interposed between the magnetoresistance effect element MR and the common wiring WC. In this case, since the two spin filters SF and SF2 are interposed between the first wiring W1 and the common wiring WC, filtering performance of spinning electrons to be injected into the magnetoresistance effect element MR can be improved, and thus the writing current $I_W$ can further be lowered.

What is claimed is:

1. A magnetic memory formed by arranging a plurality of storage areas, wherein each storage area comprises:
   a first wiring for supplying a writing current;
   a second wiring for supplying a reading current;
   a common wiring;
   a magnetoresistance effect element; and
   a spin filter provided on the magnetoresistance effect element, and
   said magnetoresistance effect element is located between said first wiring and said common wiring,
   said magnetoresistance effect element is located between said second wiring and said common wiring,
   said magnetoresistance effect element is electrically connected to said common wiring,
   said magnetoresistance effect element is connected to said first wiring via said spin filter, and
   said magnetoresistance effect element is electrically connected to said second wiring without said spin filter.

2. The magnetic memory according to claim 1, wherein said spin filter of each storage area has:
   a nonmagnetic conductive layer provided on said magnetoresistance effect element; and
   a pinned layer in contact with said nonmagnetic conductive layer,
   said first wiring is provided on a first region on said pinned layer, and
   said second wiring is provided on a second region adjacent to said first region of said nonmagnetic conductive layer.

3. The magnetic memory according to claim 2, wherein in each storage area, between said first region and said second region, a step is interposed, and a margin region where neither said first wiring nor said second wiring is formed exists.

4. The magnetic memory according to claim 2, wherein an area S2 of said second region is equal to or less than 50% of an area S1 of said first region.

5. The magnetic memory according to claim ,1 wherein each storage area further comprises a second spin filter interposed between the magnetoresistance effect element and the common wiring.

* * * * *